United States Patent [19]
Yoshino

[11] Patent Number: 5,924,290
[45] Date of Patent: Jul. 20, 1999

[54] OPTOELECTRONIC ELEMENT MODULE

[75] Inventor: Takashi Yoshino, Tokyo, Japan

[73] Assignee: NEC Corporation, Tokyo, Japan

[21] Appl. No.: 09/019,736

[22] Filed: Feb. 6, 1998

[30]      Foreign Application Priority Data

Feb. 7, 1997  [JP]  Japan .................................... 9-024988

[51] Int. Cl.⁶ .............................. F25B 21/02; F28F 7/00; H01L 23/34
[52] U.S. Cl. ................................ 62/3.7; 165/81; 165/185; 257/719
[58] Field of Search ........................... 62/3.2, 3.3, 259.2, 62/3.7; 165/185, 81, 82; 257/718, 719–722

[56]              References Cited

U.S. PATENT DOCUMENTS

| | | | |
|---|---|---|---|
| 4,733,932 | 3/1988 | Frenkel et al. | 350/96.2 |
| 5,581,441 | 12/1996 | Porter | 361/701 |
| 5,584,183 | 12/1996 | Wright et al. | 62/3.7 |
| 5,699,229 | 12/1997 | Brownell | 361/719 |
| 5,704,212 | 1/1998 | Erler et al. | 62/3.2 |
| 5,704,213 | 1/1998 | Smith et al. | 62/3.7 |

FOREIGN PATENT DOCUMENTS

| | | | |
|---|---|---|---|
| 3307933 | 10/1984 | Germany . | |
| 62-276892 | 12/1987 | Japan . | |
| 403141663 | 6/1991 | Japan | 257/722 |
| 404071257 | 3/1992 | Japan | 257/722 |
| 4-63669 | 5/1992 | Japan . | |

OTHER PUBLICATIONS

Patent Abstracts of Japan. vol. 096. No. 12, Dec. 1996.
Patent Abstracts of Japan, vol. 012, No. 167 (E–610), May 19, 1988.
Patent Abstracts of Japan, vol. 096, No. 12, Dec. 26, 1996.
Patent Abstracts of Japan, vol. 017, No. 032 (E–1309), Jan. 21, 1993.

*Primary Examiner*—William Doerrler
*Attorney, Agent, or Firm*—Sughrue, Mion, Zinn, Macpeak & Seas, PLLC

[57]              ABSTRACT

An optoelectronic element module is provided, which has improved reliability in cooling performance. This module is comprised of an optoelectronic element, a Peltier unit for cooling the optoelectronic element, and a package encapsulating the optoelectronic element and the Peltier unit. The optoelectronic element is mounted directly on or indirectly through a supporting member on a first surface of the Peltier unit. A second surface of the Peltier unit is engaged with a mounting surface of the package by an engaging structure while allowing the Peltier unit to shift along the mounting surface of the package. A thermal stress caused by a difference between thermal expansion coefficients of the second surface of the Peltier unit and the mounting surface of the package is relaxed by a positional shift of the Peltier unit along the mounting surface of the package with respect to the package. Preferably, the engaging structure produces a magnetic-field force or elastic force for engagement.

8 Claims, 3 Drawing Sheets

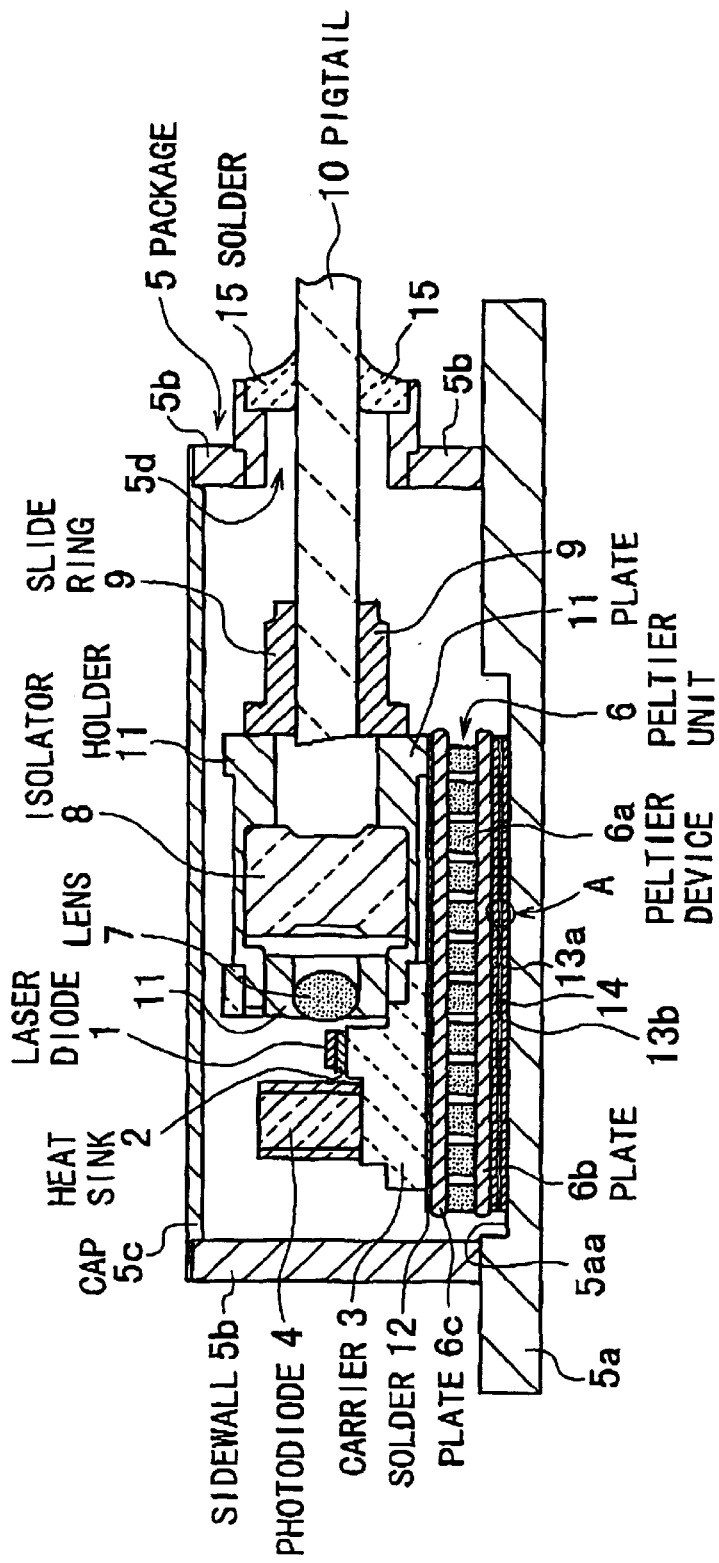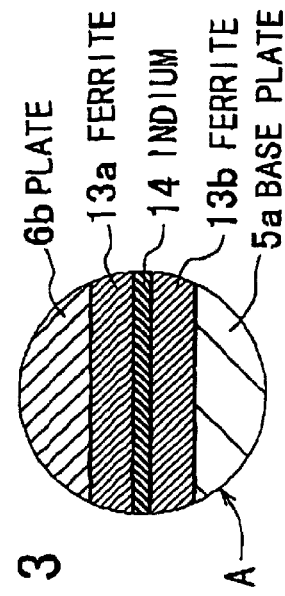

OPTOELECTRONIC ELEMENT MODULE

BACKGROUND OF THE INVENTION

1. Field of the Invention

The present invention relates to an optoelectronic element module and more particularly, to an optoelectronic element module having an optoelectronic element such as a laser diode and a Peltier device for cooling the element, both of which are encapsulated in a package.

2. Description of the Prior Art

FIG. 1 shows a conventional laser diode module applicable to the optical communication field.

As shown in FIG. 1, this conventional laser diode module has a laser diode assembly, a lens holder assembly, and a Peltier unit 106, which are encapsulated in a package 105. These two assemblies are located on the Peltier unit 106.

The package 105 is formed by a flat base plate 105a on which the Peltier unit 106 is placed, a sidewall 105b fixed onto the base plate 105a to surround the laser diode and lens holder assemblies and the Peltier unit 106, and a flat cap 105c fixed to the sidewall 105b. The bottom end of the sidewall 105b is connected to the base plate 105a. The cap 105c is connected to the top end of the sidewall 105b. The inner space of the package 105 has a shape of an approximately rectangular parallelepiped.

The Peltier unit 106 serves to cool the laser diode 101 on operation. The Peltier unit 106 is comprised of a lower flat plate 106b, an upper flat plate 106c parallel to the lower plate 106b, and a plurality of pairs of Peltier devices 106a regularly arranged along the lower and upper plates 106b and 106c between these plates 106b and 106c. The pairs of Peltier devices 106a are sandwiched by the lower and upper plates 106b and 106c.

The laser diode assembly includes a laser diode (i.e., semiconductor laser) 101, a heat sink 102, a thermally conductive carrier 103, and a photodiode 104.

The laser diode 101 is mounted on the carrier 103 through the heat sink 102 for sinking the heat generated in the diode 101 on operation. The laser diode 101 serves as a light source for emitting a predesigned output light beam.

The photodiode 104 is mounted directly on the carrier 103 at the back of the laser diode 101. The photodiode 104 serves to monitor the output light beam emitted from the laser diode 101.

The carrier 103 serves to carry or support the laser diode 101, the heat sink 102, and the photodiode 104. The carrier 103 is fixed onto the upper plate 106c of the Peltier unit 106 by a solder layer 112a made of a solder such as BiSn or InPbAg.

The lens holder assembly includes a lens holder 111, an optical lens 107, an optical isolator 108, a slide ring 109, and a pigtail 110.

The lens holder 111 has an approximately cylindrical shape and is mounted on the upper plate 106c of the Peltier unit 106 in front of the laser diode 101 by the solder layer 112a. The rear end of the lens holder 111 is engaged with the carrier 103.

The optical lens 107 and the optical isolator 108 are held in the inside of the lens holder 111 to be located on its longitudinal axis. The lens 107 is located at the back end of the holder 111 in the vicinity of the laser diode 101. The lens 107 serves to collect the output light beam emitted from the laser diode 101.

The isolator 108 is located at approximately the middle of the holder 111 apart from the lens 107. The isolator 108 serves to prevent reflected light of the output light beam from entering the pigtail 110.

The pigtail 110 is formed by a short piece of an optical fiber. An inner end of the pigtail 110 is fixed to an opposing front end of the lens holder 111 by the slide ring 109. The slide ring 109 is fixed to the holder 111 and the pigtail 110 by spot welding using an Yttrium-Aluminum-Garnet (YAG) laser. The pigtail 110 extends along the longitudinal axis of the lens holder 111 and the base plate 105a of the package 105. An outer end (not shown) of the pigtail 110 protrudes from the package 105 through a window 105d of the package 105. An optical fiber (not shown) is connected to the outer end of the pigtail 110 outside the package 105 as necessary. The window 105d is formed in the sidewall 105b. The pigtail 110 is fixed by a solder material 115 such as indium (In).

The lower plate 106a of the Peltier unit 106 is fixed to a mounting surface 105aa of the package 105 by a solder layer 112b. The mounting surface 105aa is formed on the upper surface of the base plate 105a of the package 105. This solder layer 112b is made of a solder such as BiSn or InPbAg.

The output light beam, which is emitted from the laser diode 101 on operation, passes through the lens 107 and the isolator 108 to enter the pigtail 110 at its inner end. The output light beam is transmitted by an optical fiber (not shown) connected to the outer end of the pigtail 110.

The heat generated by the laser diode 101 on operation is propagated to the Peltier unit 106 through the heat sink 102 and the carrier 103. Then, the heat is effectively transmitted by the Peltier unit 106 to the base plate 105a of the package 105, thereby cooling the laser diode 101 on operation. The heat transmitted to the base plate 105a is automatically radiated away through a board (not shown) on which the laser diode module is mounted.

When the conventional laser diode module in FIG. 1 is used as an excitation or driving source for an optical fiber amplifier, a high optical output needs to be taken out from this module stably. In this case, a driving current for the laser diode 101 is required to be set as large as approximately 500 mA. Such the large driving current usually raises the temperature of the laser diode 101 on operation by approximately 30 degrees in centigrade.

To keep the normal operation of the laser diode 101 stable at such the raised temperatures, therefore, the Peltier unit 106 is necessary to be large-sized for the purpose of large cooling capacity. This leads to a wider heat-transmission area of the lower plate 106b of the Peltier unit 106 to the base plate 105a of the package 105 than popular laser diode modules designed for optical communication.

Thus, the conventional laser diode module shown in FIG. 1 has the following problem.

Because of the wide heat-transmission area between the Peltier unit 106 and the package 105, this conventional laser diode module is unable to withstand an environmental test including abrupt temperature change such as an ON/OFF test of the Peltier unit 106. As a result of this, there is a problem that this conventional module has insufficient reliability from the viewpoint of temperature change.

The reason is that the Peltier unit 106 is destroyed or damaged due to thermal stress caused by the difference between the thermal expansion coefficients of the lower plate 106b of the Peltier unit 106 and the base plate 105a of the package 105, thereby eliminating or degrading the predesigned cooling performance of the Peltier unit 106.

A known solution to this problem is disclosed in the Japanese Non-Examined Patent Publication No. 62-276892 published in December 1987. In this solution, the lower plate 106c of the Peltier unit 106 is approximated in thermal expansion coefficient to the base plate 105a of the package 105 by selecting the materials. However, the following problem will occur.

Specifically, since the lower and upper plates 106b and 106c of the Peltier unit 106 are usually made of a ceramic such as aluminum nitride (AlN) and alumina ($Al_2O_3$), the package 105 needs to be made of a metal such as Fe—Ni—Co alloy termed "kovar" or CuW alloy containing 20% copper (i.e., CuW-20 alloy) in order to approximate its thermal expansion coefficient to the ceramic. However, these alloys have thermal expansion coefficients as low as approximately 0.5 cal/cm•sec•deg. Thus, it is difficult for the above-identified known solution disclosed in the Japanese Non-Examined Patent Publication No. 62-276892 to ensure a desired cooling performance at a driving current of approximately 500 mA.

Another known solution to the above-identified problem relating to insufficient reliability is disclosed in the Japanese Non-Examined Utility-Model Publication No. 4-63669 published in May 1992. In this solution, the package 105, the lower and upper plates 106c and 106b of the Peltier unit 106, and the carrier 103 are approximated in thermal expansion coefficient to each other. However, the same problem as the solution disclosed in the Japanese Non-Examined Patent Publication No. 62-276892 will occur.

SUMMARY OF THE INVENTION

Accordingly, an object of the present invention is to provide an optoelectronic element module having improved reliability in cooling performance.

Another object of the present invention is to provide an optoelectronic element module having improved thermal-stress resistance.

Still another object of the present invention is to provide an optoelectronic element module having a satisfactory cooling performance at a large driving current of approximately 500 mA for a laser diode.

The above objects together with others not specifically mentioned will become clear to those skilled in the art from the following description.

An optoelectronic element module according to the present invention is comprised of an optoelectronic element, a Peltier unit for cooling the optoelectronic element, and a package encapsulating the optoelectronic element and the Peltier unit.

The optoelectronic element is mounted directly on or indirectly through a supporting member on a first surface of the Peltier unit.

A second surface of the Peltier unit is engaged with a mounting surface of the package by an engaging structure while allowing the Peltier unit to shift along the mounting surface of the package.

With the optoelectronic element module according to the present invention, the optoelectronic element is mounted on the first surface of the Peltier unit. Also, the second surface of the Peltier unit is engaged with the mounting surface of the package by the engaging structure. Therefore, heat generated in the optoelectronic element on operation is efficiently transmitted to the Peltier unit through the first surface of the Peltier unit, thereby cooling the optoelectronic element.

The heat transmitted to the Peltier unit is further transmitted to the package through the second surface of the Peltier unit and the mounting surface of the package. The heat transmitted to the package is then radiated away in the atmosphere through any mounting member such as a board on which the optoelectronic element module is mounted.

If abrupt temperature change is applied to this optoelectronic element module, thermal stress tends to be generated in the second surface of the Peltier unit by the difference between the thermal expansion coefficients of the second surface of the Peltier unit and the mounting surface of the package.

However, such the thermal stress as above is suppressed or eliminated to thereby prevent the degradation of the cooling performance of the Peltier unit. This is because the second surface of the Peltier unit is engaged with the mounting surface of the package by the engaging structure while allowing the Peltier unit to move along the mounting surface of the package, thereby making it possible to relatively shift in position the Peltier unit along the mounting surface of the package.

This enables the formation of the package by a material having a high thermal conductivity enough for a satisfactory cooling performance at a large driving current of approximately 500 mA for a laser diode.

As a result, this module has improved reliability in cooling performance. This means that the thermal-stress resistance of this module is improved.

In a preferred embodiment of the module according to the present invention, the engaging structure includes at least one magnetized ferromagnetic member located between the second surface of the Peltier unit and the mounting surface of the package. The Peltier unit is engaged with the mounting surface of the package by a magnetic-field force generated by the at least one ferromagnetic member and an opposing magnetized part of the package.

In another preferred embodiment of the module according to the present invention, the engaging structure includes first and second magnetized ferromagnetic members. The first magnetized ferromagnetic member is fixed to the second surface of the Peltier unit. The second magnetized ferromagnetic member is fixed to the mounting surface of the package. The Peltier unit is engaged with the mounting surface of the package by a magnetic-field force generated between the first and second ferromagnetic members.

In this embodiment, preferably, the first and second ferromagnetic members are opposed to each other through an intervening non-magnetic member. The non-magnetic member serves as a cushion and/or serves to prevent the first and second ferromagnetic members from adhering strongly.

In still another preferred embodiment of the module according to the present invention, the engaging structure includes at least one spring located in the package. The Peltier device is engaged with the mounting surface of the package by an elastic force generated by the at least one spring.

In a further preferred embodiment of the module according to the present invention, the optoelectronic element is built in an optoelectronic element assembly, and the engaging structure includes at least one spring located in the package. The at least one spring is located to apply a pressing force to the optoelectronic element assembly, thereby engaging the second surface of the Peltier unit with the mounting surface of the package.

In this embodiment, preferably, one end of the at least one spring is fixed to an opposite surface of the package to the mounting surface thereof.

BRIEF DESCRIPTION OF THE DRAWINGS

In order that the invention may be readily carried into effect, it will now be described with reference to the accompanying drawings.

FIG. 2 is a cross-sectional view of a laser diode module according to a first embodiment of the invention.

FIG. 3 is an enlarged, partial cross-sectional view of the part A in FIG. 2.

DETAILED DESCRIPTION OF THE PREFERRED EMBODIMENTS

Figure 1:
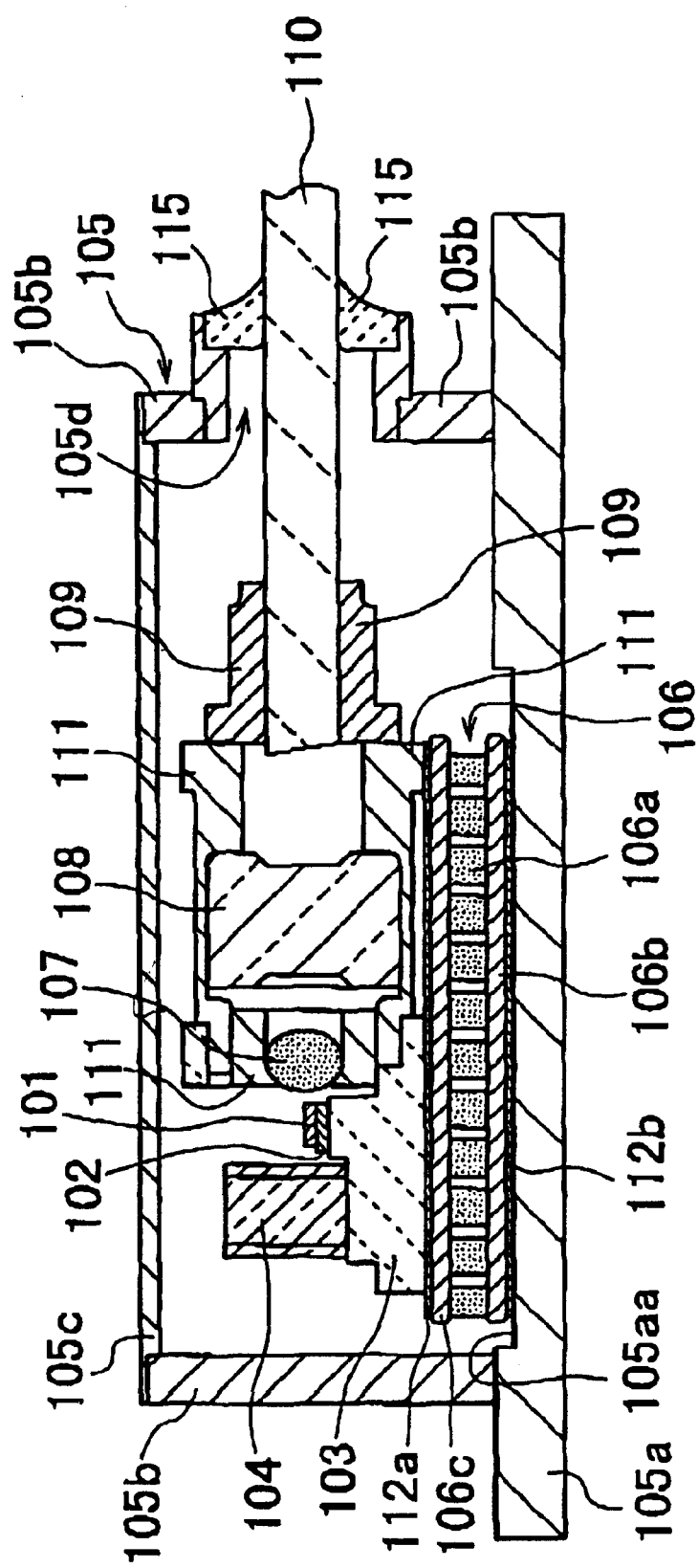
FIG. 1 is a cross-sectional view of a conventional laser diode module.

Preferred embodiments of the present invention will be described below referring to the drawings attached.

First Embodiment

A laser diode module according to a first embodiment of the present invention has a configuration as shown in FIGS. 2 and 3.

As shown in FIG. 2, this laser diode module has a laser diode assembly, a lens holder assembly, and a Peltier unit 6, which are encapsulated in a metallic package 5. These two assemblies are located on the Peltier unit 6.

The package 5 is formed by a flat base plate 5a on which the Peltier unit 6 is placed, a sidewall 5b fixed onto the base plate 5a to surround the laser diode and lens holder assemblies, and a flat cap 5c fixed to the sidewall 105b. The bottom end of the sidewall 5b is connected to the base plate 5a. The cap 5c is connected to the top end of the sidewall 5b. The inner space of the package 5 has a shape of an approximately rectangular parallelepiped.

The package 5 is made of a CuW alloy containing 30% copper (i.e., CuW-30 alloy) having a thermal conductivity of approximately 0.69 cal/cm·sec·deg, which is higher than the CuW-20 alloy.

The Peltier unit 6 serves to cool the laser diode 1 on operation. The Peltier unit 6 is comprised of a lower flat plate 6b, an upper flat plate 6c parallel to the lower plate 6b, and a plurality of pairs of Peltier devices 6a regularly arranged along the lower and upper plates 6b and 6c between these plates 6 and 6c. The pairs of Peltier devices 6a are sandwiched by the lower and upper plates 6b and 6c.

The lower and upper plates 6a and 6b are made of a ceramic such as AlN or $Al_2O_3$. The pairs of Peltier devices 6a are made of suitable semiconductor materials or metals, respectively.

The laser diode assembly includes a laser diode 1, a metallic heat sink 2, a metallic carrier 3, and a photodiode 4.

The laser diode 1 is mounted on the carrier 3 through the heat sink 2 for sinking the heat generated in the diode 1 on operation. The laser diode 1 serves as a light source for emitting a predesigned output light beam.

The photodiode 4 is mounted directly on the carrier 3 at the back of the laser diode 1. The photodiode 4 serves to monitor the output light beam emitted from the laser diode 1.

The carrier 3 serves to carry or support the laser diode 1, the heat sink 2, and the photodiode 4. The carrier is made of a CuW-30 alloy. The carrier 3 is fixed onto an upper plate 6c of the Peltier unit 6 by a solder layer 12 made of a solder such as BiSn or InPbAg.

The lens holder assembly includes a lens holder 11, an optical lens 7, an optical isolator 8, a slide ring 9, and a pigtail 10.

The lens holder 11 has an approximately cylindrical shape and is mounted on the upper plate 6c of the Peltier unit 6 in front of the laser diode 1 by the solder layer 12. The rear end of the lens holder 11 is engaged with the carrier 3.

The optical lens 7 and the optical isolator 8 are held in the inside of the lens holder 11 to be located on its longitudinal axis. The lens 7 is located at the back end of the holder 11 in the vicinity of the laser diode 1. The lens 7 serves to collect the output light beam emitted from the laser diode 1.

The isolator 8 is located at approximately the middle of the holder 11 apart from the lens 7. The isolator 8 serves to prevent reflected light of the output light beam from entering the pigtail 10.

The pigtail 10 is formed by a short piece of an optical fiber. An inner end of the pigtail 10 is fixed to the opposing end of the lens holder 11 by the slide ring 9. The slide ring 9 is fixed to the holder 11 and the pigtail 10 by spot welding using a YAG laser. The pigtail 10 extends along the longitudinal axis of the lens holder 11 and the base plate 5a of the package 5. An outer end (not shown) of the pigtail 10 protrudes from the package 5 through a window 5d of the package 5. An optical fiber (not shown) is connected to the outer end of the pigtail 10 outside the package 5 as necessary. The window 5d is formed in the sidewall 5b. The pigtail 10 is fixed by a solder material 15 made of a solder such as indium (In).

Unlike the above-described conventional laser diode module shown in FIG. 1, the lower plate 6b of the Peltier unit 6 is not fixed to a mounting surface 5aa of the base plate 5a of the package 5. A lower surface of the lower plate 6b of the Peltier unit 6 is engaged with the mounting surface 5aa of the package 5 by an engaging structure while allowing the Peltier unit 6 to move along the mounting surface 5aa of the package 5.

Specifically, a ferrite ($CoFe_2O_4$ or $NiFe_2O_4$) film 13a is attached onto the lower surface of the lower plate 6b, and another ferrite ($CoFe_2O_4$ or $NiFe_2O_4$) film 13b is attached onto the mounting surface 5aa of the base plate 5a of the package 5. An indium film 14 with a very soft property is sandwiched by the ferrite films 13a and 13b. The ferrite films 13a and 13b are opposed to one another through the indium film 14.

The ferrite films 13a and 13b have a same thickness of 2 $\mu$m. The indium film 14 has a thickness of 1 $\mu$m. The ferrite films 13a and 13b and the indium film 14 have good thermal conductivity not to degrade the thermal transmission property between the Peltier unit 6 and the base plate 5a of the package 5. The ferrite films 13a and 13b are magnetized in advance to generate a pulling magnetic-field force between these films 13a and 13b.

The indium film 14 serves as a cushion to prevent any shock to the Peltier unit 6 from being applied on attaching the Peltier unit 6 to the base plate 5a of the package 5. Also, the indium film 14 serves to prevent the ferrite films 13a and 13b from being adhered strongly, allowing the ferrite films 13a and 13b to be relatively shifted due to thermal stress.

Thus, the Peltier unit 6 (and the laser diode and lens holder assemblies located thereon) is held at a specific position by a friction force generated by the pulling magnetic-field force between the lower ferrite film 13b and the indium film 14 and a friction force generated by the pulling magnetic-field force between the upper ferrite film 13a and the indium film 14. The Peltier unit 6 is able to be shifted along the mounting surface 5aa of the package 5 if excessive thermal stress occurs between the base plate 5a of the package 5 and the lower plate 6b of the Peltier unit 6.

The magnetic-field force is optionally set as a specific magnitude. For example, the magnetic-field force is determined so that the holding or engaging strength of the Peltier unit 6 is able to withstand vibrations with a frequency of 20 to 2000 Hz and 20 g and impacts with 500 g, where g is the gravitational constant.

The output light beam, which is emitted from the laser diode 1 on operation, passes through the lens 7 and the isolator 8 to enter the pigtail 10 at its inner end. The output light beam is transmitted by an optical fiber (not shown) connected to the outer end of the pigtail 10.

The heat generated by the laser diode 1 on operation is propagated to the Peltier unit 6 through the heat sink 2 and the carrier 3. Then, the heat is effectively transmitted by the Peltier unit 6 to the base plate 5a of the package 5, thereby cooling the laser diode 1 on operation. The heat transmitted to the base plate 5a is automatically radiated away through a board (not shown) on which the laser diode module is mounted in the atmosphere.

With the laser diode module according to the first embodiment shown in FIGS. 2 and 3, the laser diode 1 is mounted on the upper plate 6c of the Peltier unit 6 through the carrier 3. Also, the lower plate 6b of the Peltier unit 6 is engaged with the mounting surface 5aa of the base plate 5a of the package 5 by the engaging structure formed by the ferrite films 13a and 13b and the indium film 14.

Therefore, heat generated in the laser diode 1 on operation is efficiently transmitted to the Peltier unit 6 through the carrier 3, thereby cooling the laser diode 1.

The heat transmitted to the Peltier unit 6 is further transmitted to the base plate 5a of the package 5 and then, transmitted to a board (not shown) on which the laser diode module is mounted, thereby radiating the heat in the atmosphere.

If abrupt temperature change is applied to the laser diode module according to the first embodiment, thermal stress tends to be generated in the lower plate 6b of the Peltier unit 6 by the difference between the thermal expansion coefficients of the lower plate 6b and the base plate 5a of the package 5. However, such the thermal stress as above is suppressed or eliminated. The reason is as follows:

Because the Peltier unit 6 is engaged with the mounting surface 5aa of the package 5 by the engaging structure while allowing the Peltier unit 6 to shift along the mounting surface 5aa of the package 5, the mechanical stress induced by thermal stress is relaxed due to a relative, positional shift of the Peltier unit 6. Thus, destruction and damage of the Peltier unit 6 are prevented from occurring.

This enables the formation of the package 5 by a CuW-30 alloy having a high thermal conductivity enough for a satisfactory cooling performance at a large driving current of approximately 500 mA for the laser diode 1. As a result, this module has improved reliability in cooling performance. In other words, the thermal-stress resistance of this module is improved.

Additionally, the upper plate 6c of the Peltier unit 6 is not approximated in thermal-expansion coefficient to the carrier 3 and these two members 6c and 3 are fixed to one another by the solder layer 12 in the first embodiment. However, the heat-transmission area of the carrier 3 to the Peltier unit 6 is comparatively narrow. Therefore, no problem will occur even at a large driving current of approximately 500 mA for the laser diode 1.

Second Embodiment

Figure 4:
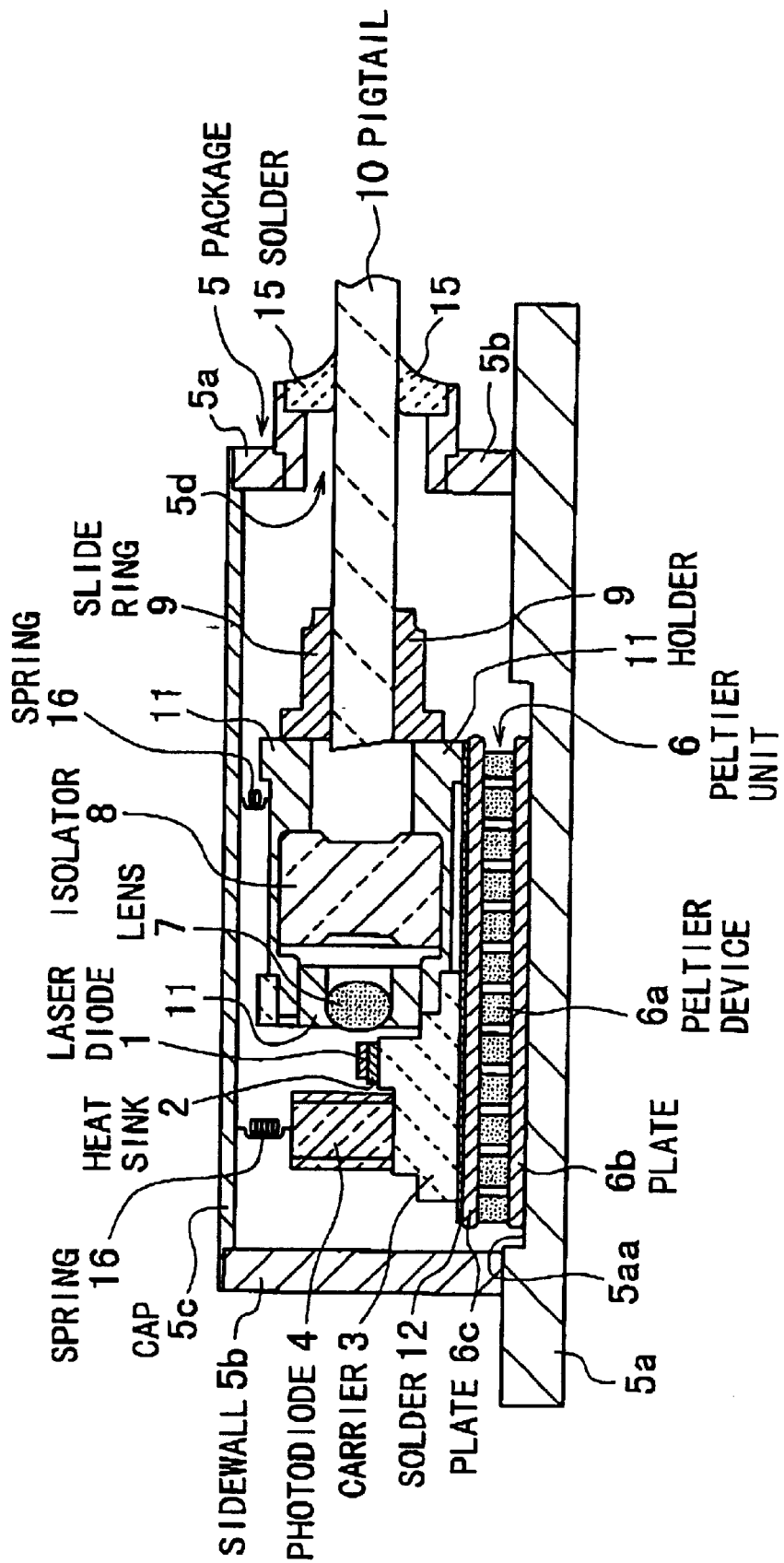
FIG. 4 is a cross-sectional view of a laser diode module according to a second embodiment of the invention.

FIG. 4 shows a laser diode module according to a second embodiment of the present invention. This embodiment has the same configuration as the first embodiment except that (a) the ferrite films 13a and 13b and the indium film 114 are canceled and that (b) compression springs 16 are additionally provided in the inner space of the package 5.

Therefore, the explanation about the same configuration is omitted here by attaching the same reference numerals to the same or corresponding parts or elements in FIG. 4 for the sake of simplification of description.

As seen from FIG. 4, because the ferrite films 13a and 13b and the indium film 114 in the first embodiment are canceled, the lower plate 6b of the Peltier unit 6 is directly contacted with the mounting surface 5aa of the base plate 5a of the package 5. Similar to the first embodiment, the lower plate 6a is not fixed to the base plate 5a.

Further, a group of the compression springs 16 are located between the cap 5c of the package 5 and the photodiode 4 and another remaining group of the springs 16 are located between the cap 5c and the lens holder 11. Upper ends of the springs 16 are fixed to the cap 5c. Lower ends of the springs 16 are contacted with the corresponding upper surfaces of the photodiode 4 and the lens holder 11. These springs 16 apply elastic pressing forces to the photodiode 4 and the lens holder 11 toward the base plate 5a of the package 5.

The Peltier unit 6 (and the laser diode and lens holder assemblies located thereon) is held at a specific position by a friction force generated by the elastic pressing forces of the springs 16. The Peltier unit 6 is able to be shifted along the mounting surface 5aa of the package 5 if excessive thermal stress occurs between the base plate 5a of the package 5 and the lower plate 6b of the Peltier unit 6.

The elastic pressing force is optionally set as a specific magnitude. For example, the elastic pressing force is determined so that the holding or engaging strength of the Peltier unit 6 is able to withstand vibrations with a frequency of 20 to 2000 Hz and an acceleration of 20 g and impacts with 500 g, where g is the gravitational constant.

As described above, in the second embodiment, the Peltier unit 6 is engaged with the base plate 5a of the package 5 by the elastic pressing forces of the springs 16. Also, the Peltier unit 6 onto which these two assemblies are fixed is held at specific positions. Therefore, it is needless to say that there are the same advantages as those in the first embodiment.

Although a laser diode is used as an optoelectronic element in the above first and second embodiments, it is needless to say that any other optoelectronic elements such as a light-emitting diode or the like may be used if it needs to be cooled on operation.

Further, it is clear that the optoelectronic element such as any transistor or the like may be used if it needs to be cooled on operation.

While the preferred forms of the present invention has been described, it is to be understood that modifications will be apparent to those skilled in the art without departing from the spirit of the invention. The scope of the invention, therefore, is to be determined solely by the following claims.

What is claimed is:

1. An optoelectronic element module comprising:

an optoelectronic element;

a Peltier unit for cooling said optoelectronic element; and a package encapsulating said optoelectronic element and said Peltier unit;

wherein said optoelectronic element is mounted to a first surface of said Peltier unit;

and wherein a second surface of said Peltier unit is engaged with a mounting surface of said package by a magnetic engaging structure so as to allow said Peltier unit to shift along said mounting surface of said package;

and wherein a thermal stress caused by a difference between thermal expansion coefficients of said second surface of said Peltier unit and said mounting surface of said package is relaxed by a positional shift of said Peltier unit along said mounting surface of said package with respect to said package.

2. A module as claimed in claim 1, wherein said magnetic engaging structure includes at least one magnetized ferromagnetic member located between said second surface of said Peltier device and said mounting surface of said package;

and wherein said Peltier unit is engaged with said mounting surface of said package by a magnetic-field force generated by said at least one ferromagnetic member and an opposing magnetized part of said package.

3. A module as claimed in claim 1, wherein said magnetic engaging structure includes first and second magnetized ferromagnetic members;

and wherein said first magnetized ferromagnetic member is fixed to said second surface of said Peltier unit;

and wherein said second magnetized ferromagnetic member is fixed to said mounting surface of said package;

and wherein said Peltier unit is engaged with said mounting surface of said package by a magnetic-field force generated between said first and second ferromagnetic members.

4. A module as claimed in claim 3, wherein said first and second ferromagnetic members are opposed to each other through an intervening non-magnetic member.

5. An optoelectronic element module comprising:

an optoelectronic element;

a Peltier unit for cooling said optoelectronic element; and a package encapsulating said optoelectronic element and said Peltier unit;

wherein said optoelectronic element is mounted to a first surface of said Peltier unit;

wherein a second surface of said Peltier unit is engaged with a mounting surface of said package by an engaging structure so as to allow said Peltier unit to shift along said mounting surface of said package;

wherein said engaging structure includes at least one compression spring located in said package such that said Peltier device is engaged with said mounting surface of said package by an elastic force generated by said at least one compression spring; and wherein a thermal stress caused by a difference between thermal expansion coefficients of said second surface of said Peltier unit and said mounting surface of said package is relaxed by a positional shift of said Peltier unit along said mounting surface of said package with respect to said package.

6. A module as claimed in claim 5, wherein said optoelectronic element is built in an optoelectronic element assembly;

and wherein said at least one compression spring is located to apply a pressing force to said optoelectronic element assembly, thereby engaging said second surface of said Peltier unit with said mounting surface of said package.

7. A module as claimed in claim 6, wherein one end of said at least one spring is fixed to an opposite surface of said package to said mounting surface thereof.

8. An optoelectronic element module comprising:

an optoelectronic element;

a Peltier unit for cooling said optoelectronic element; and a package encapsulating said optoelectronic element and said Peltier unit;

wherein said optoelectronic element is mounted to a first surface of said Peltier unit;

said module further including means for magnetically engaging a second surface of said Peltier unit with a mounting surface of said package so as to allow said Peltier unit to shift along said mounting surface of said package;

and wherein a thermal stress caused by a difference between thermal expansion coefficients of said second surface of said Peltier unit and said mounting surface of said package is relaxed by a positional shift of said Peltier unit along said mounting surface of said package with respect to said package.

* * * * *